United States Patent
Lazic et al.

(10) Patent No.: US 9,312,098 B2
(45) Date of Patent: Apr. 12, 2016

(54) METHOD OF EXAMINING A SAMPLE IN A CHARGED-PARTICLE MICROSCOPE

(71) Applicant: FEI Company, Hillsboro, OR (US)

(72) Inventors: Ivan Lazic, Eindhoven (NL); Eric Gerardus Theodoor Bosch, Eindhoven (NL); Faysal Boughorbel, Eindhoven (NL); Bart Buijsse, Eindhoven (NL); Kasim Sader, Doorwerth (NL); Sorin Lazar, Eindhoven (NL)

(73) Assignee: FEI Company, Hillsboro, OR (US)

( * ) Notice: Subject to any disclaimer, the term of this patent is extended or adjusted under 35 U.S.C. 154(b) by 0 days.

(21) Appl. No.: 14/629,387

(22) Filed: Feb. 23, 2015

(65) Prior Publication Data
US 2015/0243474 A1   Aug. 27, 2015

(30) Foreign Application Priority Data
Feb. 24, 2014 (EP) ..................................... 14156356

(51) Int. Cl.
| | |
|---|---|
| *H01J 37/26* | (2006.01) |
| *H01J 37/244* | (2006.01) |
| *H01J 37/28* | (2006.01) |

(52) U.S. Cl.
CPC ............ *H01J 37/244* (2013.01); *H01J 37/265* (2013.01); *H01J 37/28* (2013.01); *H01J 2237/2802* (2013.01)

(58) Field of Classification Search
USPC .................. 250/305, 306, 307, 309, 310, 311
See application file for complete search history.

(56) References Cited

U.S. PATENT DOCUMENTS

| | | | |
|---|---|---|---|
| 2007/0194225 A1* | 8/2007 | Zorn | 250/306 |
| 2013/0193322 A1* | 8/2013 | Blackburn | 250/311 |

FOREIGN PATENT DOCUMENTS

| | | |
|---|---|---|
| GB | 2019691 A | 10/1979 |

OTHER PUBLICATIONS

Scheinfein, M. R., et al., "Scanning electron microscopy with polarization analysis (SEMPA)", Review of Scientific Instruments, 1990, pp. 2501-2526, vol. 61, No. 10, Melville, NY, US.

(Continued)

*Primary Examiner* — Nicole Ippolito
(74) *Attorney, Agent, or Firm* — Scheinberg & Associates, PC; Michael O. Scheinberg

(57) ABSTRACT

Examining a sample in a charged-particle microscope of a scanning transmission type includes:
- Providing a beam of charged particles that is directed from a source through an illuminator so as to irradiate the sample;
- Providing a detector for detecting a flux of charged particles traversing the sample;
- Causing said beam to scan across a surface of the sample, and recording an output of the detector as a function of scan position, resulting in accumulation of a charged-particle image of the sample,
- Embodying the detector to comprise a plurality of detection segments;
- Combining signals from different segments of the detector so as to produce a vector output from the detector at each scan position, and compiling this data to yield a vector field; and
- Mathematically processing said vector field by subjecting it to a two-dimensional integration operation, thereby producing an integrated vector field image.

20 Claims, 13 Drawing Sheets

(56) References Cited

OTHER PUBLICATIONS

Nomizu, S., et al., "Reconstruction of Magnetic Recording Spatial Pattern on the Tape Media by Reflection Electron Beam Tomography", IEEE Transactions on Magnetics, 1997, pp. 4032-4034, vol. 33, No. 5, New York, NY, US.

Yajima, Y., et al., "Scanning Lorentz electron microscope with high resolution and observation of bit profiles recorded on sputtered longitudinal media (invited)", Journal of Applied Physics, 1993, pp. 5811-5815, vol. 73, No. 10, US.

Escovitz, W. H., et al., "Scanning Transmission Ion Microscope with a Field Ion Source," Proc. Nat. Acad. Sci., vol. 72, No. 5, pp. 1826-1828, 1975 USA.

Unknown, http://en.wikipedia.org/wiki/Electron_microscope, accessed May 22, 2015.

Unknown, http://en.wikipedia.org/wiki/Scanning_electron_microscope, accessed May 22, 2015.

Unknown, http://en.wikipedia.org/wiki/Transmission_electron_microscopy, accessed May 22, 2015.

Unknown, http://en.wikipedia.org/wiki/Scanning_Helium_Ion_Microscope, accessed May 22, 2015.

Unknown, http://en.wikipedia.org/wiki/Electron_tomography, accessed May 22, 2015.

Unknown, http://en.wikipedia.org/wiki/HAADF, accessed May 22, 2015.

Unknown, http://en.wikipedia.org/wiki/Position_sensitive_device, accessed May 22, 2015.

Unknown, http://en.wikipedia.org/wiki/Vector_calculus, accessed May 22, 2015.

Pintus, R., et al., "3D Sculptures From SEM Images," EMC 2008 European Microscopy Congress Sep. 1-5, 2008, Aachen, Germany, pp. 597-598.

Unknown, http://en.wikipedia.org/wiki/Scanning_transmission_electron_microscopy, accessed May 22, 2015.

Frankot, Robert T., et al., "A Method for Enforcing Integrability in Shape from Shading Algorithms," IEEE Transacations on Pattern Analysis and Machine Intelligence, vol. 10, No. 4, pp. 439-451, 1988.

Aggarwal, Guarav, et al., "Face Recognition in the Presence of Multiple Illumination Sources," Computer Vision, Tenth IEEE International Conference, vol. 2, pp. 1169-1176, 2005, Bejing, China.

* cited by examiner

BF

HAADF

S1-S3

S2-S4 iVF

PiVF

LiVF

LPiVF

BF iVF

PiVF

LiVF

ABF

S2-S4 iVF diVF(Y)

METHOD OF EXAMINING A SAMPLE IN A CHARGED-PARTICLE MICROSCOPE

The invention relates to a method of examining a sample in a charged-particle microscope of a scanning transmission type, comprising the following steps:
- Providing a beam of charged particles that is directed from a source through an illuminator so as to irradiate the sample;
- Providing a detector for detecting a flux of charged particles traversing the sample;
- Causing said beam to scan across a surface of the sample, and recording an output of the detector as a function of scan position, thereby allowing accumulation of a charged-particle image of the sample.

The invention also relates to a charged-particle microscope in which such a method can be performed.

As used throughout this text, the ensuing terms should be interpreted so as to be consistent with the following explanation:
- The phrase "charged particle" encompasses an electron or ion (generally a positive ion, such as a Gallium ion or Helium ion, for example, although a negative ion is also possible; the ion in question may be a charged atom or molecule). The term may also refer to a proton, for example.
- The term "microscope" refers to an apparatus that is used to create a magnified image of an object, feature or component that is generally too small to be seen in satisfactory detail with the naked human eye. In a charged-particle microscope (CPM), an imaging beam of charged particles is directed onto a sample from an illuminator. In a transmission-type CPM (TCPM), a detector is used to intercept a flux of charged particles that traverse the sample, generally with the aid of an imaging system that is used to focus (part of) said flux onto the detector. Such a TCPM can be used in scanning mode (STCPM), in which case the beam of charged particles from the illuminator is scanned across the sample, and the detector output is recorded as a function of scan position. In addition to imaging, a CPM may also have other functionalities, such as performing spectroscopy, examining diffractograms, performing (localized) surface modification (e.g. milling, etching, deposition), etc.
- The term "illuminator" refers to a particle-optical column comprising one or more electrostatic and/or magnetic lenses that can be used to manipulate a "raw" charged-particle beam from a source (e.g. a Schottky source or ion gun), serving to provide it with a certain focus or deflection, for example, and/or to mitigate one or more aberrations therein. If desired, an illuminator can be provided with a deflector system that can be invoked to cause the beam to perform a scanning motion across the sample being investigated.

In what follows, the invention may by way of example sometimes be set forth in the specific context of electron microscopy. However, such simplification is intended solely for clarity/illustrative purposes, and should not be interpreted as limiting.

Charged-particle microscopy is a well-known and increasingly important technique for imaging microscopic objects, particularly in the form of electron microscopy. Historically, the basic genus of electron microscope has undergone evolution into a number of well-known apparatus species, such as the Transmission Electron Microscope (TEM), Scanning Electron Microscope (SEM), and Scanning Transmission Electron Microscope (STEM), and also into various sub-species, such as so-called "dual-beam" tools (e.g. a FIB-SEM), which additionally employ a "machining" Focused Ion Beam (FIB), allowing supportive activities such as ion-beam milling or Ion-Beam-Induced Deposition (IBID), for example. In a TEM, the electron beam used to irradiate a sample will generally be of significantly higher energy than in the case of a SEM (e.g. 300 keV vs. 10 keV), so as to allow its constituent electrons to penetrate the full depth of the sample; for related reasons, a sample investigated in a TEM will also generally need to be thinner than one investigated in a SEM. In traditional electron microscopes, the imaging beam is "on" for an extended period of time during a given imaging capture; however, electron microscopes are also available in which imaging occurs on the basis of a relatively short "flash" or "burst" of electrons, such an approach being of possible benefit when attempting to image moving samples or radiation-sensitive specimens, for example. More information on some of the topics elucidated here can, for example, be gleaned from the following Wikipedia links:
- http://en.wikipedia.org/wiki/Electron_microscope
- http://en.wikipedia.org/wiki/Scanning_electron_microscope
- http://en.wikipedia.org/wiki/Transmission_electron_microscopy
- http://en.wikipedia.org/wiki/Scanning_transmission-_electron_microscopy In addition, some information vis-à-vis non-electron-based CPMs can, for example, be gleaned from sources such as the following:
- http://en.wikipedia.org/wiki/Scanning_Helium_Ion_Microscope
- W. H. Escovitz, T. R. Fox and R. Levi-Setti, *Scanning Transmission Ion Microscope with a Field Ion Source*, Proc. Nat. Acad. Sci. USA 72(5), pp 1826-1828 (1975).

A (S)TEM is a relatively versatile tool, and can be used in a variety of modes to investigate a sample. Apart from "conventional" TEM imaging, there are also specialized STEM techniques such as BF (Bright Field), ADF (Annular Dark Field) and HAADF (High-Angle ADF) imaging, e.g. as alluded to in the following Wikipedia links:
- http://en.wikipedia.org/wiki/Electron_tomography
- http://en.wikipedia.org/wiki/HAADF Although such techniques have their own advantages, they also suffer from various drawbacks. For example, in the case of "conventional" TEM imaging, readily interpretable imagery can only be obtained by subjecting raw data to relatively cumbersome MTF (Modulation Transfer Function)/CTF (Contrast Transfer Function) inversions. On the other hand, specialized techniques such as BF, ADF and HAADF imaging are relatively "wasteful" in that, in order to achieve a desired degree of contrast, they necessarily restrict themselves to using a relatively narrow angular range of signal particles in the detected flux from the sample; since relatively few of the available electrons are used for imaging, such techniques tend to suffer from a sub-optimal Signal-to-Noise Ratio (SNR). This is not a trivial problem: many samples (such as biological and/or cryogenic specimens, for instance) may be highly sensitive to radiation-induced damage, so that one generally cannot indulge in the luxury of trying to improve SNR by using an increased image accumulation time and/or an increased irradiating beam current, since this can lead to unacceptable sample damage; in such circumstances, it is frustrating to have to discard a relatively large portion of the valuable available flux from the sample. Any attempt to alleviate this problem by collecting a greater angular range of said flux will typically lead to poorer contrast.

It is an object of the invention to address these issues. In particular, it is an object of the invention to provide a radically new method of investigating a sample with an STCPM. Moreover, it is an object of the invention that this method should make more efficient use of available resources, and provide results not currently attainable with prior-art techniques.

These and other objects are achieved in a method as set forth in the opening paragraph above, which method is characterized by the following steps:

- Embodying the detector to comprise a plurality of detection segments;
- Combining signals from different segments of the detector so as to produce a vector output from the detector at each scan position, and compiling this data to yield a vector field;
- Mathematically processing said vector field by subjecting it to a two-dimensional integration operation, thereby producing an integrated vector field image.

In the context of this elucidation of the invention, the following additional explanation can be given:

- A "vector" output from the detector is an output that can be regarded as having a magnitude and a direction—as opposed to a scalar output, which would have only a magnitude. Such a vector output can typically be expressed in terms of a coordinate system, e.g. in Cartesian coordinates (X, Y) or Polar coordinates (r, θ), for instance. An example of such a vector output is an electrostatic potential field gradient, or electric field, which will have a both a magnitude (slope value) and direction (line of maximum slope). Subdividing the detector into individual segments (zones) and combining/processing the outputs from such segments generally allows a vector quantity to be distilled from the charged-particle flux impinging on the detector.
- The operation in the previous item produces a vector value for each position in a two-dimensional scanned area on the sample. Compiling this data thus leads to the creation of a vector field of the scanned area of the sample, i.e. a "map" with a vector value at each point.
- The employed integration operation is "two-dimensional" because said vector field is two-dimensional. In this context, it should be noted that a two-dimensional integration operation generally cannot be regarded as a mere juxtaposition of two, independent, linear (i.e. one-dimensional) integrals. Instead, the integration operation is "convoluted" (or degenerate) in that integrating in one direction has a simultaneous effect on the integration result in another direction. The integration is conducted over the two-dimensional scan area traced/rastered out by the scanning motion of the charged-particle beam in the STCPM. For each point in this path, there is a location-specific vector value as alluded to in the previous item.
- Two-dimensional integration of a vector field as set forth above produces a scalar result (scalar field).

These points will be elucidated in more detail below.

The method according to the current invention has a number of striking advantages. For example:

- The integrated vector field image of the current invention uses a vector field as input, and this has an associated magnitude and direction at each point. The presence of this directional (phase) information creates depth and other extra image detail that is not produced by prior-art imaging techniques.
- By integrating a vector field, the invention achieves image contrast without the need to restrict itself to a pre-defined angular range of charged particles in the detected flux. Unlike "conventional" STEM imaging, for example, it can, in principle, detect the entire flux of charged particles traversing the sample, and still provide a contrast-rich image. Because it is capable of simultaneously "processing" a variety of angular ranges in said flux, it can simultaneously reveal both high-frequency and low-frequency components in the Fourier spectrum of the sample image.
- The previous point enables a drastic improvement in SNR. This, for example, allows much more effective investigation of radiation-sensitive samples, since:
  - For a given radiation dose, more information can be gleaned than in prior-art techniques; or alternatively,
  - To obtain a given amount of data, a lower radiation dose is generally required than in the prior art.
- Because the present method essentially provides a relative abundance of contrast, one now has a practical possibility to trade (excess) contrast for (more) resolution. To this end, attained resolution can be adjusted by altering an illumination mode of the charged-particle beam impinging on the sample e.g. by adjusting input beam opening/convergence angle, switching between filled-cone (so-called "on-axis") and hollow-cone (so-called "off-axis" or "annular") illumination, etc., which effectively serves to change the Numerical Aperture (NA) of the illuminating beam. For instance, one could elect to perform a two-step (or multi-step) investigation whereby:
  - One initially uses a relatively low resolution (smaller NA) but relatively high contrast, e.g. to obtain general shape information regarding the sample;
  - One can then switch to higher resolution (larger NA) and lower contrast, for further sample analysis.

As a general remark regarding the chosen illumination mode of the impinging beam, it should be noted that, in addition to the above-mentioned adjustment of the effective NA of the illuminating beam, one can also, for example, adjust the focus/defocus of said beam, thereby causing the beam focus (crossover) to reach to different depths within a sample. This can be of particular interest when studying thick samples, where a focus-series of different images can be obtained and later used in a three-dimensional reconstruction of the sample by solving a (mathematical) linear inverse problem. In charged-particle microscopy, the (illumination mode of the) beam impinging on the sample is often referred to as the "probe".

- The current method can produce an imaging result that can be directly interpreted without the necessity of applying techniques such as MTF/CTF corrections. For example, if the vector quantity referred to above is electrostatic potential field gradient, or electric field, then integrating it in two dimensions will yield a map of electrostatic potential field of the sample which is a directly interpretable/meaningful physical quantity in charged-particle microscopy, in that it is directly proportional to the amount of phase shift that a charged-particle wave undergoes in traversing the sample (causing it to scatter elastically).
- The approach according to the current invention does not require a complicated image acquisition scheme (with associated calibration/alignment aspects) such as that prescribed by techniques such as ptychography and holography.

These and other aspects of the invention will be elucidated in more detail below.

In a particular embodiment of the current invention:
The employed detector is embodied to comprise four quadrants;
Said vector output is produced by calculating difference signals between complementary pairs of quadrants.

Such a four-quadrant detector can be employed as follows. The detector can be disposed along the (extrapolated) optical axis of the particle-optical beam impinging upon the sample, in such a way that this (extrapolated) optical axis intercepts the detector at a central common corner of the four quadrants (which are oriented so as to face (the rear side of) the sample). Alternatively, the detector can be embodied to have a central hole (opening), and this hole can be centered on said (extrapolated) optical axis. A charged particle propagating along this axis and experiencing no deflection in the sample will then strike the center of the detector, whereas a charged particle that experiences a deflection (scattering) in the sample will have its trajectory deviated away from said axis, and onto one (or more) of the quadrants of the detector. In practice, the flux of charged particles traversing and emerging from the sample will be fanned out into a (quasi-)conical shape, with a mean deflection (from the optical axis) that depends inter alia on the structure/composition of the sample. By calculating difference signals between (detected electrical currents from) different quadrants of the detector, one can obtain a (rudimentary) quantification of said mean deflection since such calculation reveals the relative extent to which the flux falls more on one quadrant than on another. One can now (for example) choose a Cartesian coordinate system (X, Y) such that one (opposed) pair of quadrants straddles an X axis and another (opposed) pair of quadrants straddles the complementary Y axis; in that case, performing the abovementioned difference calculation can yield a gradient vector with (X, Y) coordinates. This vector will have a given value (magnitude/direction) for each coordinate point in the path scanned out on the sample/detector, thus defining a vector field (which could, for example, be visualized by plotting it as a so-called "needle map", similar to the way a wind field is plotted in meteorology). This vector field can then be integrated two-dimensionally with respect to X and Y, to yield the novel integrated vector field image of the present invention. Suitable mathematical algorithms for performing this non-trivial integration operation will be set forth in more detail hereunder.

It should be explicitly noted in the embodiment just discussed, but also in other embodiments of the invention (such as the next two to be discussed below), that the vector employed in the current invention can be multiplied by one or more proportionality constants without affecting the crux of the invention. For example, the position of a (particle) radiation spot on a segmented detector (relative to an elected origin) is of itself a vector. However, with due regard to the operating principle of the detector, such a vector can be assigned a specific physical meaning, e.g. an electrostatic potential field gradient (electric field), which is also a vector. Mathematically, it makes no difference which vector is integrated two-dimensionally: one can convert from one vector to the other (and from one integration result to the other) via a simple (resultant) proportionality constant.

In an alternative embodiment of the current invention which may be regarded as a refinement (or "higher-resolution" version) of the previously discussed embodiment the following applies:
The employed detector is embodied as a pixelated detector comprising an array of pixels;
Said vector output is produced using a procedure comprising the following steps:
Comparing pixel values to determine a location for a barycenter of said flux on the detector;
Expressing a coordinate position of said barycenter on the detector.

With regard to this embodiment, the following should be noted:
Said array (matrix arrangement) of pixels may, for example, be laid out along an orthogonal (Cartesian) grid or a nested set of concentric circles (Polar arrangement), for instance. Such arrangements can, respectively, lend themselves to expression of the abovementioned barycenter coordinates in Cartesian or Polar coordinates.
Examples of such detectors include CMOS, CCD and SSPM (Solid State Photo-Multiplier) arrays, e.g. comprising (multiples or fractions of) 1024×1024 pixels.
Because the detection segments (pixels) in such an array are typically much smaller and more numerous than the detection segments in the previous embodiment (quadrants), they generally allow a much more accurate localization of the mean deflection referred to above, which manifests itself via the location of said barycenter.
Within a detector zone (patch) in which pixels are excited by impingement of the abovementioned flux of particles, said barycenter may manifest itself as a (relatively localized) "bright spot" in the middle of the zone and/or as the calculated "central" position of said zone.
It is a relatively straightforward matter to compare values (of the electrical signal) from various excited pixels and determine therefrom a barycenter position. This can be done automatically (e.g. with the aid of pattern/image recognition software) and/or manually (e.g. by visually displaying a rendition of the detector output and allowing an operator to elect a barycenter position using a computer mouse, stylus or touchscreen, for instance).

In yet another embodiment of the present invention, the employed detector is a Position-Sensitive Detector (PSD). Such detectors are available in different forms, such as:
So-called "isotropic sensors", in which a radiation-sensitive semiconductor sheet (e.g. a PIN diode layer) is bordered by several (e.g. four) peripheral electrodes. A radiation spot impinging on the sheet causes a localized resistance change, which leads to different electrical currents in said electrodes. The position of said spot then follows from relatively straightforward geometrical equations involving the differences and sums of (certain of) said currents. Such a detector is considered to be "segmented" in that it uses a distribution of electrodes to effectively sub-divide the radiation-sensitive sheet into different "electrical detection regions".
So-called "discrete sensors", which employ a pixel array of a type such as that set forth in the previous embodiment, and which yield the position of an impinging radiation spot using photogrammetry techniques, for example.

In both cases, the (center of the) spot position (e.g. in (X, Y) coordinates) is a vector, as prescribed by the current invention. For some general information on PSDs, reference is made to the following Wikipedia link:
http://en.wikipedia.org/wiki/Position_sensitive_device As regards the two-dimensional integration operation prescribed by the current invention, the area of Vector Field Integration (a sub-field of Vector Calculus) provides the basic mathematical framework needed to appropriately process the vector field distilled from the employed segmented detector. In specific instances where the vector concerned is a gradient (which allows certain simplifications to be assumed vis-à-vis its integrability), then the techniques of the more specific area of Gradient Field Integration can be applied. Examples of algorithms that can be used to perform such Gradient Field Integration on acquired image data can, for example, be gleaned from the following articles in technical journals, which concern themselves with (photon-optical) Machine Vision/Photometric Stereo issues:

Robert T. Frankot, Rama Chellappa, *IEEE Transactions On Pattern Analysis And Machine Intelligence*, 10(4) (1988).

Amit Agrawal, Rama Chellappa, Ramesh Raskar, *Computer Vision, ICCV*, 10th *IEEE International Conference* (2005).

Supplementally, information of a more general nature regarding Vector Calculus can be obtained from the following Wikipedia link:

http://en.wikipedia.org/wiki/Vector_calculus

Once the two-dimensional vector field integration according to the current invention has been conducted, the resulting "raw" integrated vector field image can, if so desired, be post-processed (i.e. "polished up") by subjecting it to further mathematical manipulation. Such manipulation can, for example, involve at least one operation selected from the group comprising:

(i) Filtering (e.g. low-pass filtering, high-pass filtering, band-pass filtering);
(ii) Opening Angle Correction;
(iii) Deconvolution correction, and combinations hereof. Such techniques can be further elucidated as follows:

(i)(a) Low-Pass Filtering:
Low-pass filtering is a filtering technique that can be used to enhance low-frequency information in (the Fourier transform of) an image, and can (for example) be realized using a Gaussian filter. An example where this can be useful is when one is interested in inner (contact) potentials or sample thickness in an image that also contains high-frequency information like atoms, or atomic columns, etc.

(i)(b) High-Pass Filtering:
High-pass filtering is a filtering technique that helps to enhance high-frequency information in (the Fourier transform of) an image, and can (for example) be achieved by subtracting a low-pass-filtered image from the corresponding original image. An example of a situation where this can be useful is when one is interested in seeing atoms or atomic columns in an image that also shows low-frequency information, like inner (contact) potential, thickness, etc.

(i)(c) Band-Pass Filtering:
A band-pass filter can be regarded as a combination of a low-pass and a high-pass filter. It attenuates/rejects frequencies outside of a given range, and passes frequencies that fall within that range.

(ii) Opening Angle Correction:
Opening Angle Correction is a sophisticated correction that can be described with the aid of the following mathematical relationships:

$$I_{iVF}^{Corr} = IFT\{FT\{I_{iVF}\} \cdot Filt\}$$

$$Filt = \begin{cases} \dfrac{1}{1 - \dfrac{q}{Kq_{max}}}, & q < q_{max} \\ 0, & q \geq q_{max} \end{cases}$$

where:
FT denotes Fourier Transform, and IFT denotes Inverse Fourier Transform;
Filt is a special opening angle corrector filter function;
$q=\sqrt{q_x^2+q_y^2}$ is intensity in the frequency (Fourier) domain;
$q_{max}$ is the highest frequency of the impinging beam spot (on the sample), which depends on the opening angle α of the beam according to $q_{max}=\alpha/\lambda$, where λ is the charged-particle wavelength of the impinging beam;
The factor K is a tuning parameter, whose value can (for example) be empirically obtained, e.g. K=1.5.

In essence, the purpose of such Opening Angle Correction is to make allowances for the NA of the particle beam impinging on the sample.

(iii) Deconvolution Correction:
The obtained raw image $I_{iVF}$ above can be written as a cross-correlation (see Embodiment 8):

$$I_{iVF} = \frac{1}{2\pi}|Probe|^2 * Orig$$

where:
Orig is a function describing an original image, quantifying the phase shift that a charged-particle beam undergoes in traversing a sample, causing it to undergo elastic scattering at each scan position.
Probe is a function describing the illumination configuration/particle-optical beam used to irradiate the sample in question. It will typically include possible imperfections, such as aberrations, incoherencies, etc. The probe function can be determined empirically, or predicted/modeled theoretically.

In the Fourier domain, this becomes:

$$FT\{I_{iVF}\} = \frac{1}{2\pi}\overline{FT\{|Probe|^2\}} \cdot FT\{Orig\}$$

where the bar denotes complex conjugation. In order to obtain the corrected original image (ideally Orig), a deconvolution step can be applied. For example:

$$I_{iVF}^{Corr} = IFT\left\{FT\{I_{iVF}\} \Big/ \left(\frac{1}{2\pi}\overline{FT\{|Probe|^2\}} + Eps\right)\right\}$$

where Eps is a tuning factor.

To complete this step, the amplitude of the Probe function must be fully known. An explicit deconvolution step of this type is not necessary if the |Probe|² function can be approximated by a Dirac delta function, whence one simply obtains:

$$I_{iVF} = \frac{1}{2\pi}Orig.$$

The skilled artisan will understand that, in general, techniques (i)-(iii) described here may be applied individually or in combination.

In another embodiment of the present invention, the inventive integrated vector field image referred to above is further manipulated by subjecting it to a Laplacian operation. The Laplacian operator is a second-order differential operator that takes the following form in two-dimensional Euclidean space, when performed on a function $f$:

$$Lf = \Delta f = \nabla^2 f = \left(\frac{\partial^2}{\partial x^2} + \frac{\partial^2}{\partial y^2}\right)f$$

In the current case, the entity $f$ may be either the "raw" integrated vector field image (iVF) produced by the invention, or a post-processed integrated vector field image (PiVF) as referred to in the previous embodiment. Performing this Laplacian operation produces an image (LiVF or LPiVF) that, for some features, can yield improved definition (though at the possible expense of other image qualities). See the examples given below in Embodiments 4 and 5, for instance. It should be noted that performing a Laplacian operation as described here may, if desired/necessary, be accompanied by multiplication by a proportionality/scaling/correction constant, such as −1 for example; this can, for instance, be done so as to make the result of the Laplacian operation more consistent with a certain physical interpretation.

It should be explicitly noted that the current invention is radically different to the so-called Differential Phase Contrast (DPC) technique. In the DPC method, a four-quadrant detector is used to produce scalar difference images such as the S1-S3 or S2-S4 images shown in FIGS. 5C and 5D below. Unlike the current invention, the DPC technique does not seek to distill a vector value from such scalar imagery, and does not compile an associated vector field; DPC therefore misses out on the directional (phase) (and associated depth) information inherent to the present invention. The DPC approach also does not perform the vector integration of the current invention, and therefore does not achieve the advantageous angular independence and noise reduction of the present invention. Since DPC does not produce an integrated image, it also does not admit post-processing techniques of the types (i)-(iii) set forth above.

BRIEF DESCRIPTION OF THE DRAWINGS

The invention will now be elucidated in more detail on the basis of exemplary embodiments and the accompanying schematic drawings, in which.

In the Figures, where pertinent, corresponding parts may be indicated using corresponding reference symbols. It should be noted that, in general, the Figures are not to scale.

EMBODIMENT 1

Figure 1:
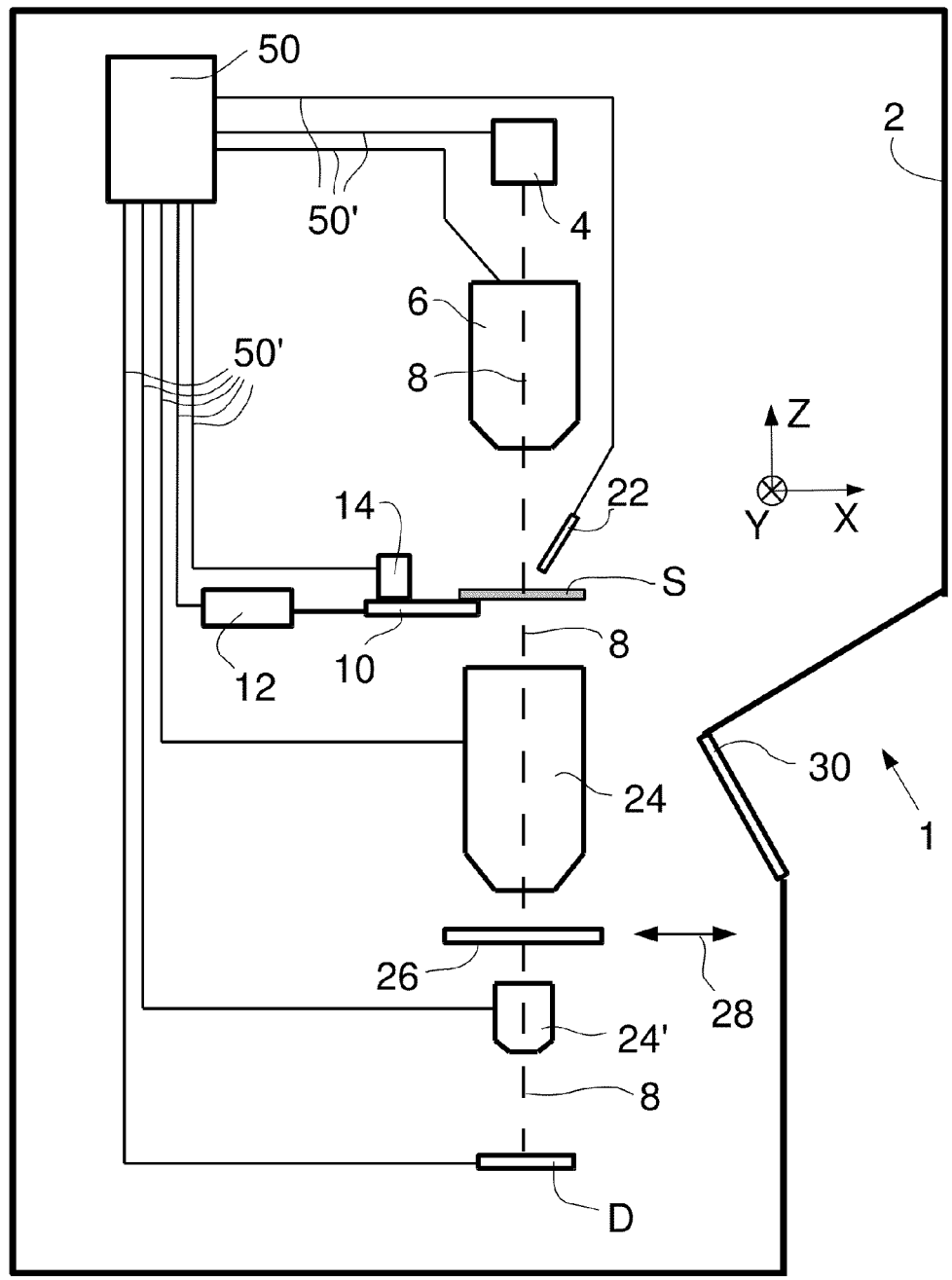
FIG. 1 renders a longitudinal cross-sectional elevation of an STCPM in which an embodiment of the current invention can be carried out.

FIG. 1 is a highly schematic depiction of an embodiment of an STCPM 1 that lends itself to use in conjunction with the current invention. In the Figure, a vacuum enclosure 2 encapsulates the STCPM, which in this case is a STEM (i.e. a TEM, with scanning functionality). In the depicted STEM, an electron source 4 (such as a Schottky gun, for example) produces a beam of electrons that traverse an electron-optical illuminator 6, serving to direct/focus them onto a chosen region of a (substantially planar) sample S. This illuminator 6 has an electron-optical axis 8, and will generally comprise a variety of electrostatic/magnetic lenses, (scan) deflectors, correctors (such as stigmators), etc.; typically, it can also comprise a condenser system.

The sample S is held on a sample holder 10 than can be positioned in multiple degrees of freedom by a positioning device (stage) 12; for example, the sample holder 10 may comprise a finger that can be moved (inter alia) in the XY plane (see the depicted Cartesian coordinate system). Such movement allows different regions of the sample S to be irradiated/imaged/inspected by the electron beam traveling along axis 8 (in the −Z direction) (and/or allows scanning motion to be performed, as an alternative to beam scanning). An optional cooling device 14 is in intimate thermal contact with the supporting device 10, and is capable of maintaining the latter at cryogenic temperatures, e.g. using a circulating cryogenic coolant to achieve and maintain a desired low temperature.

The focused electron beam traveling along axis 8 will interact with the sample S in such a manner as to cause various types of "stimulated" radiation to be emitted from the sample S, including (for example) secondary electrons, backscattered electrons, X-rays and optical radiation (cathodoluminescence); if desired, one or more of these radiation types can be detected with the aid of detector 22, which might be a combined scintillator/photomultiplier or EDX (Energy-Dispersive X-Ray Spectroscopy) detector, for instance. However, of predominant interest in the current invention are electrons that traverse (pass through) the sample S, emerge from it and continue to propagate (substantially, though generally with some deflection/scattering) along axis 8. Such transmitted electrons enter an imaging system (combined objective/projection lens) 24, which will generally comprise a variety of electrostatic/magnetic lenses, deflectors, correctors (such as stigmators), etc. In normal (non-scanning) TEM mode, this imaging system 24 can focus the transmitted electrons onto a fluorescent screen 26, which, if desired, can be retracted/withdrawn (as schematically indicated by arrows 28) so as to get it out of the way of axis 8. An image of (part of) the sample S will be formed by imaging system 24 on screen 26, and this may be viewed through viewing port 30 located in a suitable portion of the wall 2. The retraction mechanism for screen 26 may, for example, be mechanical and/or electrical in nature, and is not depicted here.

As an alternative to viewing an image on screen 26, one can instead make use of electron detector D, particularly in STEM mode. To this end, adjuster lens 24' can be enacted so as to shift the focus of the electrons emerging from imaging system 24 and re-direct/focus them onto detector D (rather than the plane of retracted screen 26: see above). At detector D, the electrons can form an image (or diffractogram) that can be processed by controller 50 and displayed on a display device (not depicted), such as a flat panel display, for example. In STEM mode, an output from detector D can be recorded as a function of (X,Y) scanning beam position on the sample S, and an image can be constructed that is a "map" of detector output as a function of X,Y. The skilled artisan will be very familiar with these various possibilities, which require no further elucidation here.

Note that the controller (computer processor) 50 is connected to various illustrated components via control lines (buses) 50'. This controller 50 can provide a variety of functions, such as synchronizing actions, providing setpoints, processing signals, performing calculations, and displaying messages/information on a display device (not depicted). Needless to say, the (schematically depicted) controller 50 may be (partially) inside or outside the enclosure 2, and may have a unitary or composite structure, as desired. The skilled artisan will understand that the interior of the enclosure 2 does not have to be kept at a strict vacuum; for example, in a so-called "Environmental STEM", a background atmosphere of a given gas is deliberately introduced/maintained within the enclosure 2.

In the context of the current invention, the following additional points deserve further elucidation:

The detector D is embodied as a segmented detector, which, for example, may be a quadrant sensor, pixelated CMOS/CCD/SSPM detector, or PSD, for instance. Specific embodiments of such detectors are shown in plan view in FIGS. 2 and 3, and will be discussed below.

Figure 2:
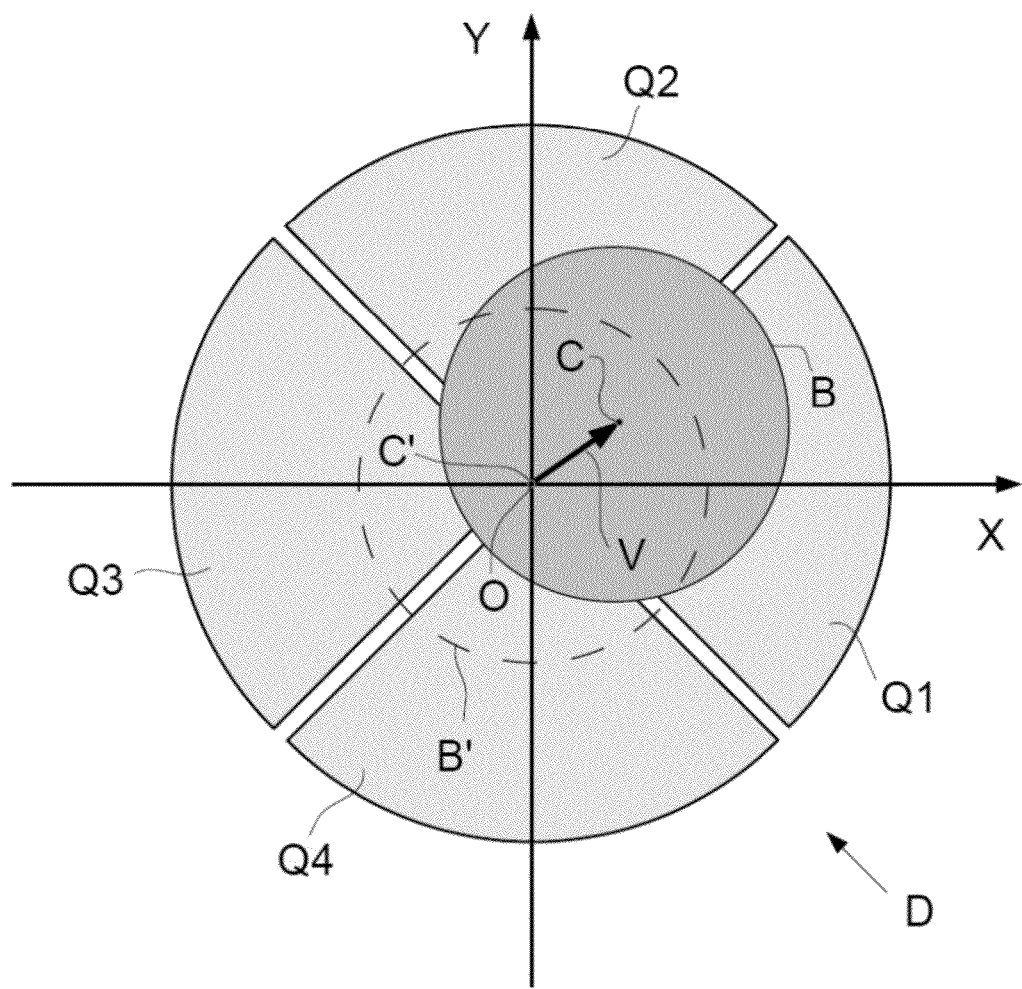
FIG. 2 depicts a plan view of a particular embodiment of a segmented detector (quadrant detector) that can be used in the subject of FIG. 1, in accordance with the current invention.

If a charged-particle beam propagating along the particle-optical axis 8 traverses the sample S without undergoing any scattering/deflection in the sample, then it will impinge (substantially) symmetrically on the center/origin O of the detector D, and (essentially) give a "null" reading. This situation is shown in more detail in FIGS. 2 and 3, which show Cartesian axes X, Y with an origin at point O, on which is centered a dashed circle that schematically represents an impingement footprint B' of a (ghost) charged-particle beam with barycenter C', such that:

In FIG. 2, this footprint B' is symmetrically overlaid on detection quadrants (electrodes) Q1, Q2, Q3, Q4. If the detection signals (electrical currents) from these quadrants are respectively denoted by S1, S2, S3, S4, then this situation will yield zero difference signals S1-S3 and S2-S4 between opposing pairs of quadrants.

Figure 3:
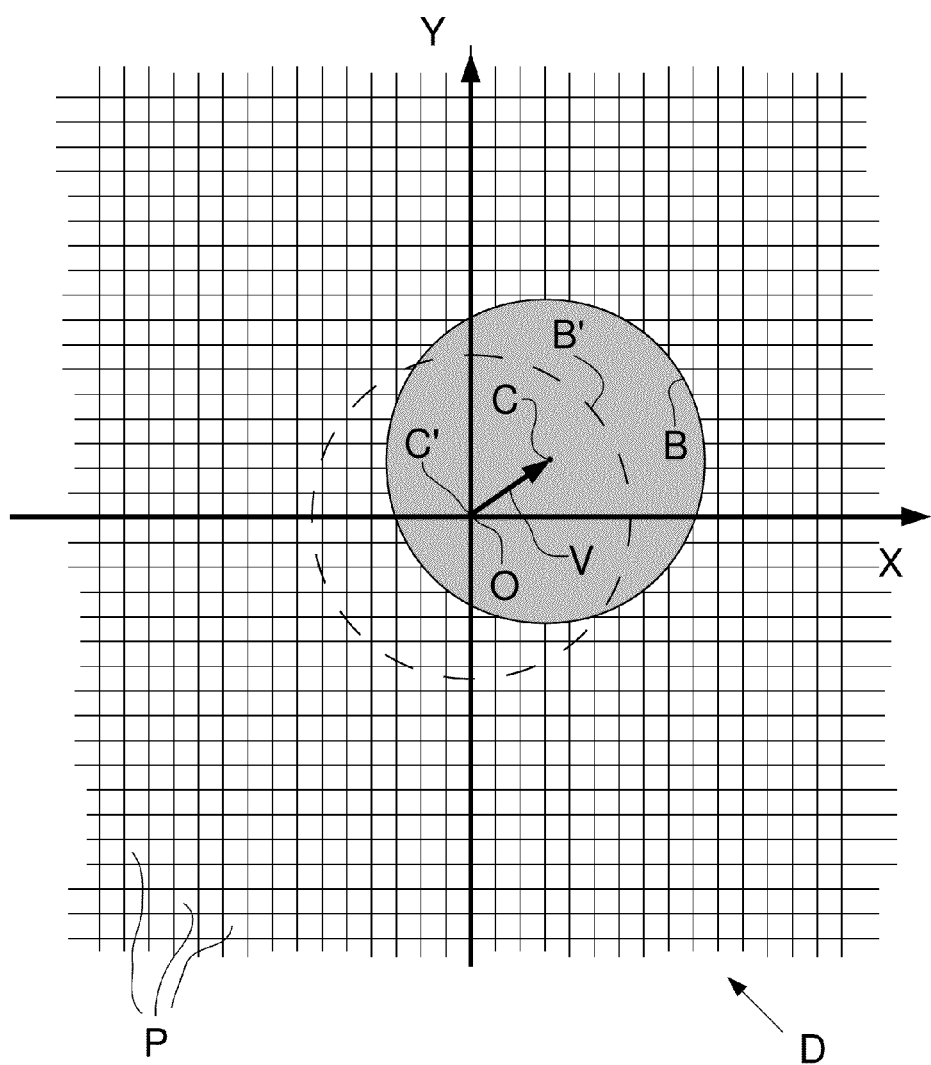
FIG. 3 depicts a plan view of another embodiment of a segmented detector (pixelated detector) that can be used in the subject of FIG. 1, in accordance with the current invention.

In FIG. 3, which depicts an orthogonal matrix of detection pixels P (e.g. in a CMOS detector, possibly with an overlaid scintillation layer), there is zero deviation between the elected origin O of said pixel matrix and barycenter C'.

If, on the other hand, a charged-particle beam undergoes some scattering/deflection in the sample S, it will land on the detector D at a position displaced from the origin O. In this context, FIGS. 2 and 3 show a beam footprint B with barycenter C that is no longer centered on O. The position of point C with respect to O defines a vector V, with an associated magnitude (length) and direction (pointing angle with respect to X axis, for example). This vector V can be expressed in terms of the coordinates ($X_C$, $Y_C$) of point C, which can be distilled as follows:

In FIG. 2, one can derive (rudimentary) estimators for $X_C$, $Y_C$ using the following formulae:

$$X_C \sim \frac{S_1 - S_3}{S_1 + S_2 + S_3 + S_4}, Y_C \sim \frac{S_2 - S_4}{S_1 + S_2 + S_3 + S_4} \quad (1)$$

In FIG. 3, one can derive values for $X_C$, $Y_C$ by examining output signals from the various pixels P, because pixels P that are impinged upon by the beam footprint B will give a different output signal (electrical resistance, voltage or current, for example) to pixels P outside the footprint B. The location of C can then be directly deduced by noting the coordinates of that particular pixel that yields an extremal signal, or indirectly determined by mathematically calculating the barycenter of the cluster of pixels P impinged on by B, or via a hybrid technique that combines both approaches, for example.

The skilled artisan will understand that the size of beam footprint B can be altered by adjusting the so-called "camera length" of the STCPM of FIG. 1, for example.

As the input charged-particle beam is scanned across the sample S so as to trace out a two-dimensional scan path (area), the approach set forth in the previous item can be used to obtain a value of V for each coordinate position along said scan path. This allows compilation of a "map" of vector V as a function of scan position on the sample S, which amounts to a mathematical field (and also a physical field, in that the vector V can be assigned a (proportional) physical meaning, such as electrostatic field vector).

The vector field resulting from the previous step can now be integrated two-dimensionally, so as to obtain an integrated vector field image according to the current invention. This aspect of the invention will be elucidated in more detail in the next Embodiment (which makes specific reference to STEM, but is equally applicable to a generic STCPM).

EMBODIMENT 2

Integrating Gradient Fields

As set forth above, a measured vector field $\tilde{E}(x,y) = (\tilde{E}_x(x,y), \tilde{E}_y(x,y))^T$ can (for example) be derived at each coordinate point (x,y) from detector segment differences using the expressions:

$$\tilde{E}_x = \frac{S_1 - S_3}{S_1 + S_2 + S_3 + S_4} \quad (2a)$$

$$\tilde{E}_y = \frac{S_2 - S_4}{S_1 + S_2 + S_3 + S_4} \quad (2b)$$

where, for simplicity, spatial indexing (x,y) in the scalar fields $\tilde{E}_x$, $\tilde{E}_y$ and $S_{i=1,\ldots,4}$ has been omitted, and where superscript T denotes the transpose of a matrix.

It is known from the theory of STEM contrast formation that $\tilde{E}$ is a measurement of the actual electric field E in an area of interest of the imaged specimen. This measurement is inevitably corrupted by noise and distortions caused by imperfections in optics, detectors, electronics, etc. From basic electromagnetism, it is known that the electrostatic potential function φ(x,y) [also referred to below as the potential map] is related to the electric field by:

$$E = -\nabla \phi \tag{3}$$

The goal here is to obtain the potential map at each scanned location of the specimen. But the measured electric field in its noisy form $\tilde{E}$ will most likely not be "integrable", i.e. cannot be derived from a smooth potential function by the gradient operator. The search for an estimate $\hat{\phi}$ of the potential map given the noisy measurements $\tilde{E}$ can be formulated as a fitting problem, resulting in the functional minimization of objective function J defined as:

$$J(\phi) = \iint \|(-\nabla \phi) - \tilde{E}\|^2 dx dy = \iint \|\nabla \phi + \tilde{E}\|^2 dx dy \tag{4}$$

where $$\nabla \varphi = (\varphi_x, \varphi_y)^T = \left(\frac{\partial \varphi}{\partial x}, \frac{\partial \varphi}{\partial y}\right)^T.$$

One is essentially looking for the closest fit to the measurements, in the least squares sense, of gradient fields derived from smooth potential functions φ.

To be at the sought minimum of J one must satisfy the Euler-Lagrange equation:

$$\frac{\partial \|\nabla \varphi + \tilde{E}\|^2}{\partial \varphi} - \frac{d}{dx}\frac{\partial \|\nabla \varphi + \tilde{E}\|^2}{\partial \varphi_x} - \frac{d}{dy}\frac{\partial \|\nabla \varphi + \tilde{E}\|^2}{\partial \varphi_y} = 0 \tag{5}$$

which can be expanded to:

$$-\frac{d}{dx}\frac{\partial \left[(\varphi_x + \tilde{E}_x)^2 + (\varphi_y + \tilde{E}_y)^2\right]}{\partial \varphi_x} - \frac{d}{dy}\frac{\partial \left[(\varphi_x + \tilde{E}_x)^2 + (\varphi_y + \tilde{E}_y)^2\right]}{\partial \varphi_y} = 0 \tag{6}$$

finally resulting in:

$$\frac{\partial^2 \varphi}{\partial x^2} + \frac{\partial^2 \varphi}{\partial y^2} = -\left(\frac{\partial \tilde{E}_x}{\partial x} + \frac{\partial \tilde{E}_y}{\partial y}\right) \tag{7}$$

which is the Poisson equation that one needs to solve to obtain Cp.

Poisson Solvers

Using finite differences for the derivatives in (7) one obtains:

$$\frac{\varphi_{i+1,j} - 2\varphi_{i,j} + \varphi_{i-1,j}}{\Delta^2} + \frac{\varphi_{i,j+1} - 2\varphi_{i,j} + \varphi_{i,j-1}}{\Delta^2} = \tag{8}$$

$$-\left(\frac{(\tilde{E}_x)_{i+1,j} - (\tilde{E}_x)_{i-1,j}}{\Delta} + \frac{(\tilde{E}_y)_{i,j+1} - (\tilde{E}_y)_{i,j-1}}{\Delta}\right)$$

where Δ is the so-called grid step size (assumed here to be equal in the x and y directions). The right side quantity in (8) is known from measurements and will be lumped together in a term $\rho_{i,j}$ to simplify notation:

$$\frac{\varphi_{i+1,j} - 2\varphi_{i,j} + \varphi_{i-1,j}}{\Delta^2} + \frac{\varphi_{i,j+1} - 2\varphi_{i,j} + \varphi_{i,j-1}}{\Delta^2} = \rho_{i,j} \tag{9}$$

which, after rearranging, results in:

$$\phi_{i-1,j} + \phi_{i,j-1} - 4\phi_{i,j} + \phi_{i,j+1} + \phi_{i+1,j} = \Delta^2 \rho_{i,j} \tag{10}$$

for i=2, . . . , N−1 and j=2, . . . , M−1, with (N,M) the dimensions of the image to be reconstructed.

The system in (10) leads to the matrix formulation:

$$L\phi = \rho \tag{11}$$

where φ and ρ represent the vector form of the potential map and measurements, respectively (the size of these vectors is N×M, which is the size of the image). The so-called Laplacian matrix L is of dimensions (N×M)² but is highly sparse and has a special form called "tridiagonal with fringes" for the discretization scheme used above. So-called Dirichlet and Neumann boundary conditions are commonly used to fix the values of $\hat{\phi}$ at the edges of the potential map.

The linear system of (11) tends to be very large for typical STEM images, and will generally be solved using numerical methods, such as the bi-conjugate gradient method. Similar approaches have previously been used in topography reconstruction problems, as discussed, for example, in the journal article by Ruggero Pintus, Simona Podda and Massimo Vanzi, 14th European Microscopy Congress, Aachen, Germany, pp. 597-598, Springer (2008). One should note that other forms of discretization of the derivatives can be used in the previously described approach, and that the overall technique is conventionally known as the Poisson solver method. A specific example of such a method is the so-called multigrid Poisson solver, which is optimized to numerically solve the Poisson equation starting from a coarse mesh/grid and proceeding to a finer mesh/grid, thus increasing integration speed.

Basis Function Reconstruction

Another approach to solving (7) is to use the so-called Frankot-Chellapa algorithm presented in the above-mentioned journal article by Frankot and Chellappa, which was previously employed for depth reconstruction from photometric stereo images. Adapting this method to the current problem, one can reconstruct the potential map by projecting the derivatives into the space-integrable Fourier basis functions. In practice, this is done by applying the Fourier Transform FT(•) to both sides of (7) to obtain:

$$(\omega_x^2 + \omega_y^2)FT(\phi) = -\sqrt{-1}(\omega_x FT(\tilde{E}_x) + \omega_y FT(\tilde{E}_y)) \tag{12}$$

from which $\hat{\varphi}$ can be obtained by Inverse Fourier Transform (IFT):

$$\hat{\varphi} = IFT\left(-\sqrt{-1}\frac{\omega_x FT(\tilde{E}_x) + \omega_y FT(\tilde{E}_y)}{\omega_x^2 + \omega_y^2}\right) \tag{13}$$

The forward and inverse transforms can be implemented using the so-called Discrete Fourier Transform (DFT), in which case the assumed boundary conditions are periodic. Alternatively, one can use the so-called Discrete Sine Transform (DST), which corresponds to the use of the Dirichlet boundary condition (φ=0 at the boundary). One can also use the so-called Discrete Cosine Transform (DCT), corresponding to the use of the Neumann boundary conditions (∇φ·n=0 at the boundary, n being the normal vector at the given boundary location).

Generalizations and Improved Solutions

While working generally well, the Poisson solver and Basis Function techniques can be enhanced further by methods that take into account sharp discontinuities in the data (outliers). For that purpose, the objective function J can be modified to incorporate a different residual error R (in (4), the residual error was $R(v)=\|v\|^2$). One can for example use exponents of less than two including so-called Lp norm-based objective functions:

$$J(\phi)=\iint R(-\nabla\phi,\tilde{E})dxdy=\iint\|(-\nabla\phi)-\tilde{E}\|^{1/p}dxdy, p\geq 1 \quad (14)$$

The residual can also be chosen from the set of functions typically used in so-called M-estimators (a commonly used class of robust estimators). In this case, R can be chosen from among functions such as so-called Huber, Cauchy, and Tuckey functions. Again, the desired result from this modification of the objective function will be to avoid overly smooth reconstructions and to account more accurately for real/physical discontinuities in the datasets. Another way of achieving this is to use anisotropic weighting functions $w_x$ and $w_y$ in J:

$$J(\phi)=\iint w_x(\epsilon_x^{k-1})(-\phi_x-\tilde{E}_x)^2+w_y(\epsilon_y^{k-1})(-\phi_y-\tilde{E}_y)^2 dxdy \quad (15)$$

where the weight functions depend on the residuals:

$$R(\epsilon_x^{k-1})=R(-\phi_x^{k-1},\tilde{E}_x) \text{ and } R(\epsilon_y^{k-1})=R(-\phi_y^{k-1},\tilde{E}_y) \quad (15a)$$

at iteration k−1.

In the above-mentioned journal article by Agrawal, Chellappa and Raskar, it was shown that, for the problem of depth reconstruction from photometric stereo images, the use of such anisotropic weights, which can be either binary or continuous, leads to improved results in the depth map recovery process.

In another approach, one can also apply a diffusion tensor D to the vector fields $\nabla\phi$ and $\tilde{E}$ with the aim of smoothing the data while preserving discontinuities during the process of solving for $\phi$, resulting in the modification of (4) into:

$$J(\phi)=\iiint D(-\nabla\phi)-D(\tilde{E})\|^2 dxdy \quad (16)$$

Finally, regularization techniques can be used to restrict the solution space. This is generally done by adding penalty functions in the formulation of the objective criterion J such as follows:

$$J(\phi)=\iint[\|(-\nabla\phi)-\tilde{E}\|^2+\lambda f(\nabla\phi)]dxdy \quad (17)$$

The regularization function $f(\nabla\phi)$ can be used to impose a variety of constraints on $\phi$ for the purpose of stabilizing the convergence of the iterative solution. It can also be used to incorporate into the optimization process prior knowledge about the sought potential field or other specimen/imaging conditions.

EMBODIMENT 3

Figure 4:
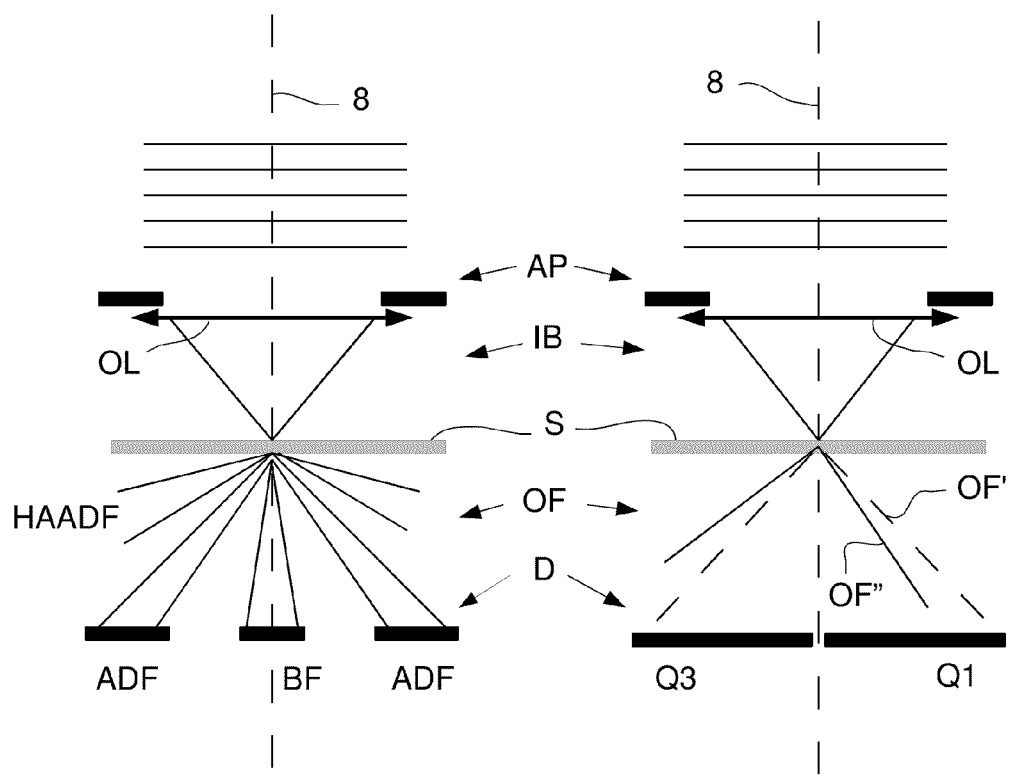
FIG. 4 illustrates certain differences between the prior art (left) and the current invention (right), particularly vis-à-vis the angular range of charged-particle flux captured and used by the employed detector.

FIG. 4 illustrates (in an elevational/longitudinal cross-section) certain differences between the prior art (left) and the current invention (right), particularly vis-à-vis the angular range of charged-particle flux captured and used by the employed detector D. In both cases (left and right), the following items are depicted:

Particle optical axis 8, sample S and detector D (see FIG. 1).

Input beam IB of charged particles, shown propagating along axis 8 toward (an upper surface of) sample S. This beam is depicted as a collimated beam that traverses an aperture AP and a particle-optical objective lens OL to become a convergent beam (filled cone) of particles.

Output flux OF, comprising charged particles of the beam IB that have traversed the sample S and emerged from (a lower surface of) sample S, here shown as a divergent cone of particles.

The following should now be noted:

(A) Prior Art

In the left-hand sub-Figure, different types of detector D are schematically illustrated. In particular:

A Bright Field (BF) detector only captures a central component of OF proximal the axis 8.

An Annular Dark Field (ADF) detector only captures a restricted annulus (hollow cone) of OF distal from the axis 8.

Also illustrated is an even more fanned-out High-Angle ADF (HAADF) component of OF, progressing toward an undepicted HAADF detector element outside the perimeter of the ADF detector elements.

It is immediately evident that each of these detection techniques restricts itself to examining only a relatively small portion of the different angular ranges (angular spread) present in OF.

(B) Current Invention

In contrast, in the right-hand sub-Figure, essentially the entire angular spread of OF is captured and used by the detector D (which is here depicted as being a four-quadrant detector, with two quadrants Q1 and Q3 illustrated). The dashed line indicates a non-deflected/non-scattered "reference" cone of flux OF' (essentially corresponding to that causing beam footprint B' in FIG. 2), whereas the solid line indicates a deflected/scattered cone of flux OF" (of a type such as that causing beam footprint B in FIG. 2). Note that the scattering angle of flux cones OF', OF" is here exaggerated: it is typically of the order of a few mrad.

Normally, capturing such a large angular range of the output flux OF [situation (B)] would result in a contrast-less image; hence the piecemeal approach used in the prior art [situation (A)], which is, however, highly wasteful, in that it discards large portions of OF at any given time. The current invention nevertheless allows the highly efficient flux collection scenario in situation (B) to be used to produce a contrast-rich image, thanks to the innovative vector field integration procedure prescribed by the present inventors.

EMBODIMENT 4

Figure 5A:
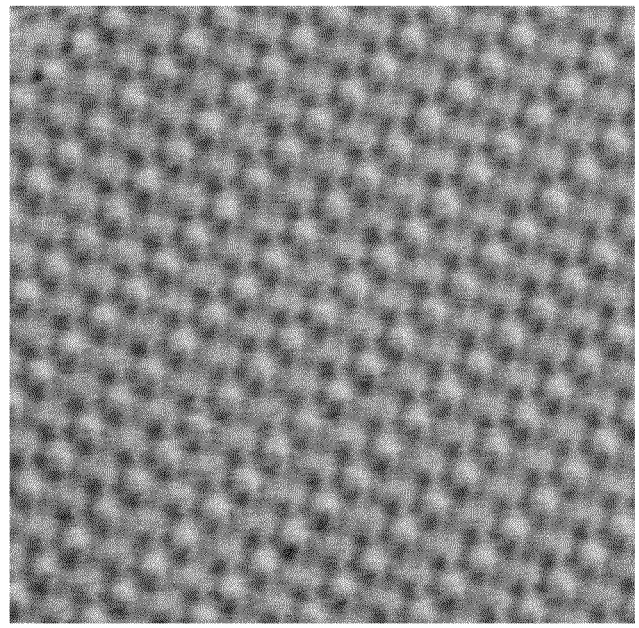
FIGS. 5A-5H show different types of STEM images of a GaN crystal, according to different aspects of the prior art and the present invention.

FIGS. 5A-5G show different types of STEM images of a GaN crystal, according to different aspects of the prior art and the present invention. The depicted field of view in all cases is ca. 4.39 nm×4.39 nm. More particularly, the individual images can be further elucidated as follows:

FIG. 5A: This is a Bright Field (BF) image, associated with (part of) a set-up such as that shown on the left side of FIG. 4. It is possible to see a repetitive structure of blobs arranged in diagonal lines, but not much more detail can be discerned with certainty.

Figure 5B:
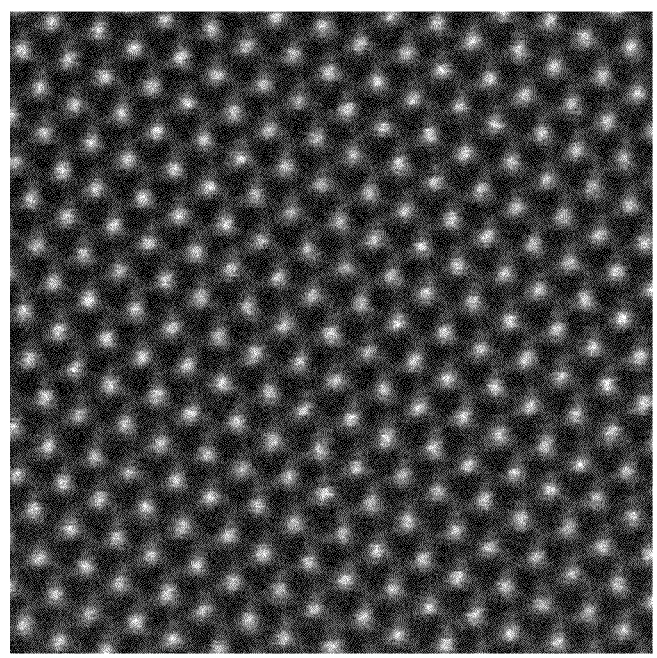

FIG. 5B: This is a High-Angle Annular Dark Field (HAADF) image, associated with (another part of) a set-up such as that shown on the left side of FIG. 4. Once again, it is possible to see a repetitive structure of blobs arranged in diagonal lines, but without much further detail.

Figure 5C:
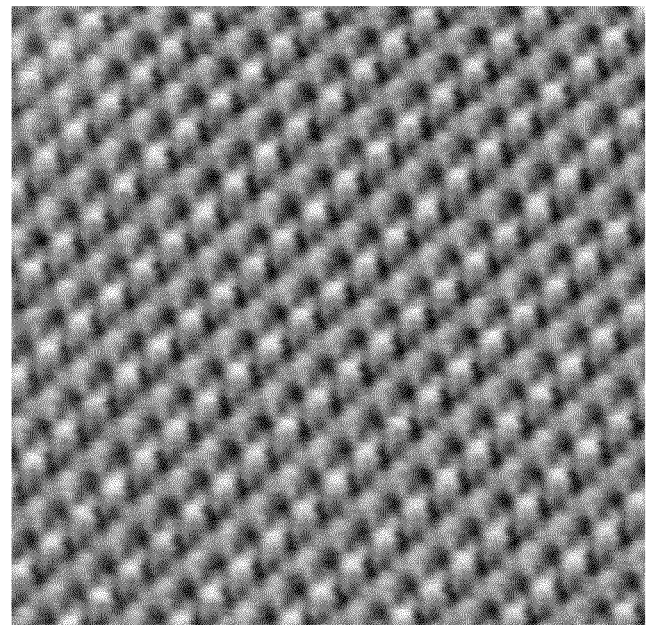
Figure 5D:
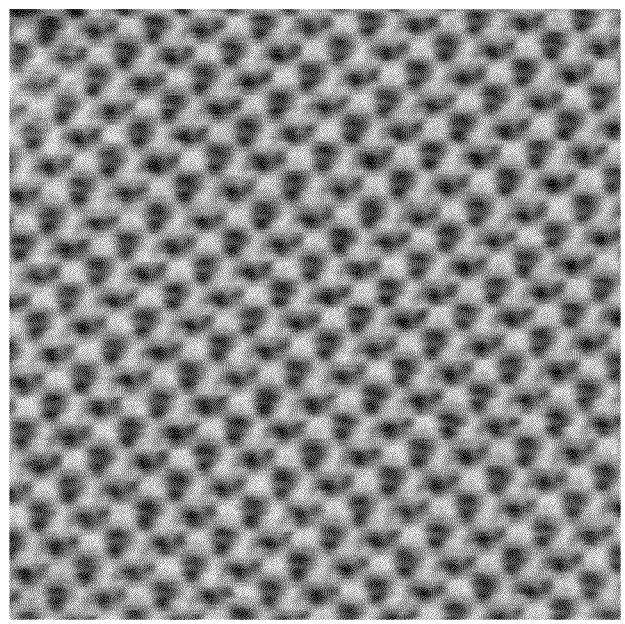

FIGS. 5C and 5D: These images were made using a four-quadrant detector in a set-up such as that depicted on the right side of FIG. 4 and in FIG. 2. They are "subtractive" or "gradient" images, in which FIG. 5C shows a scalar image based on an S1-S3 signal, and FIG. 5D shows a corresponding scalar image based on an S2-S4 signal. In these images, the blobs of FIGS. 5A and 5B start to become somewhat more structured, but are still rather non-descript.

Figure 5E:
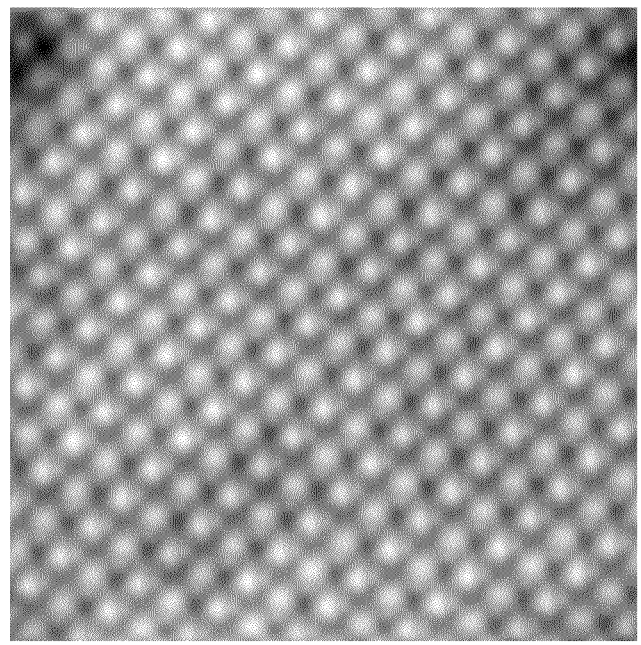

FIG. 5E: Here, the data underlying FIGS. 5C and 5D, have been treated as pertaining to the respective X- and Y-components of a vector (V), allowing a vector field to be constructed (see Eq. (1) above). This field was then subjected to a two-dimensional integration procedure according to the present invention, thereby producing an integrated vector field (iVF) image, which is essentially a map of electrostatic potential on the GaN sample. Careful inspection of this image reveals that the "blobs" referred to heretofore are actually binary in nature, with each comprising a relatively large item (Ga atom) beside a relatively small item (N atom). Of particular note is the fact that this image has a sense of depth that is absent from FIGS. 5A-5D. In addition, the top left of the image reveals substrate damage (radiation damage, due to beam dwelling) that is absent from FIGS. 5A-5D.

Figure 5F:
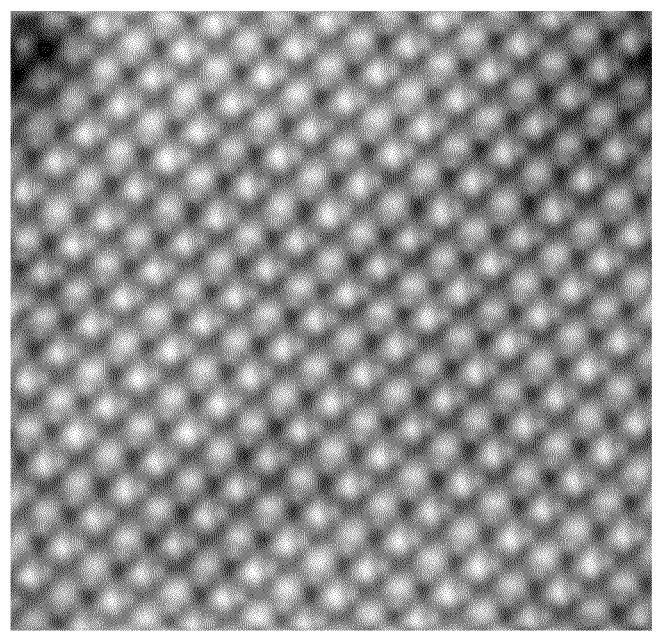

FIG. 5F: Here, the image of FIG. 5E has been "cleaned up" (processed) by subjecting it to an Opening Angle Correction (see above), thus yielding a processed iVF (PiVF) image. In this image, the individual Ga and N atoms are more clearly visible. Also clearly visible is the fact that the structure is alternating in nature, whereby:
- Along some diagonal lines, the N atom is arranged below its associated Ga atom;
- Along other (adjacent) diagonal lines, the N atom is arranged to the right of its associated Ga atom.

The Opening Angle Correction performed on the image of FIG. 5E serves to enhance its depth, and the substrate damage at the top left of the image is now even clearer.

Figure 5G:
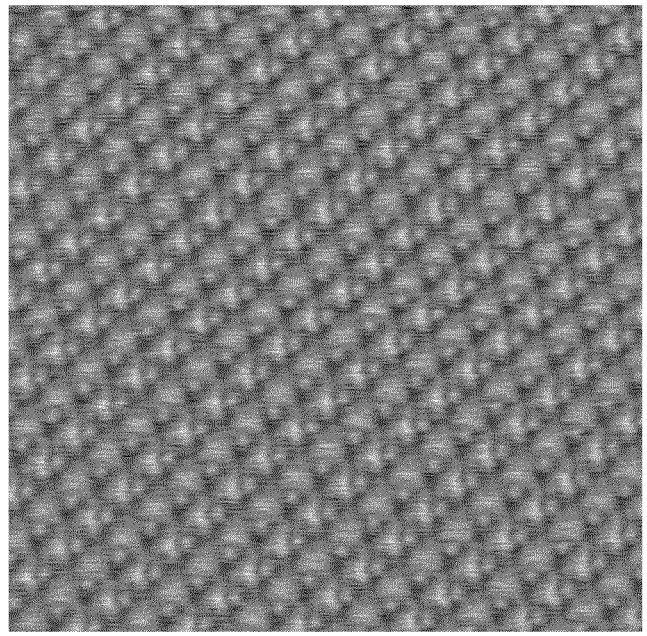

FIG. 5G: This image shows the subject of FIG. 5E after subjecting it to a Laplacian operation (to produce an LiVF image), and essentially renders a map of charge density in the GaN sample. In comparison to the previous two images, the following can be noted:
- The sense of depth is diminished.
- The N atoms appear to have become clearer in FIG. 5G, but the Ga atoms appear to have become more diffuse in form.
- The sample damage visible in the top left corners of FIGS. 5E, 5F is not visible in FIG. 5G.

Figure 5H:
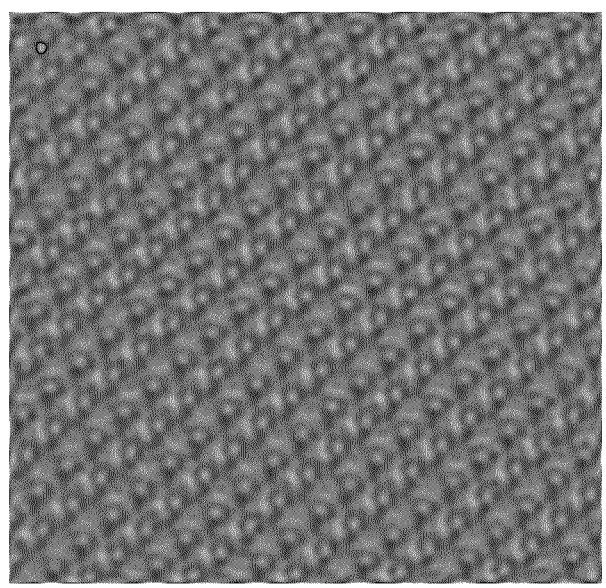

FIG. 5H: This image shows the subject of FIG. 5F after subjecting it to a Laplacian operation (to produce an LPiVF image). Because the underlying data are processed/filtered before performing the Laplacian operation, the image tends to be crisper than that in FIG. 5G.

EMBODIMENT 5

Figure 6A:
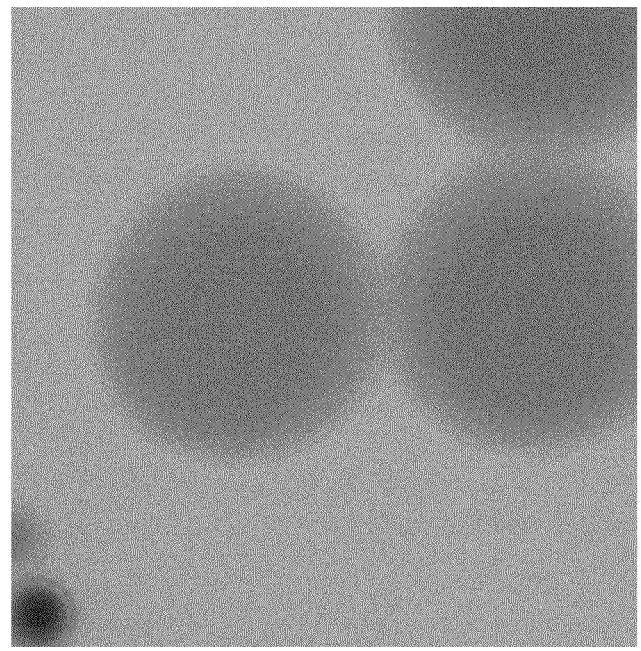
FIGS. 6A-6D show different types of STEM images of a sample comprising a collection of latex globules on an amorphous carbon carrier, according to different aspects of the prior art and the present invention.

FIGS. 6A-6D show different types of STEM images of a sample comprising a collection of latex globules on an amorphous carbon carrier, according to different aspects of the prior art and the present invention. The depicted field of view in all cases is ca. 198.85 nm×198.85 nm. More particularly, the individual images can be further elucidated as follows:

FIG. 6A: This is a Bright Field (BF) image, associated with (part of) a set-up such as that shown on the left side of FIG. 4. The latex globules manifest themselves as flat, diffuse blobs.

Figure 6B:
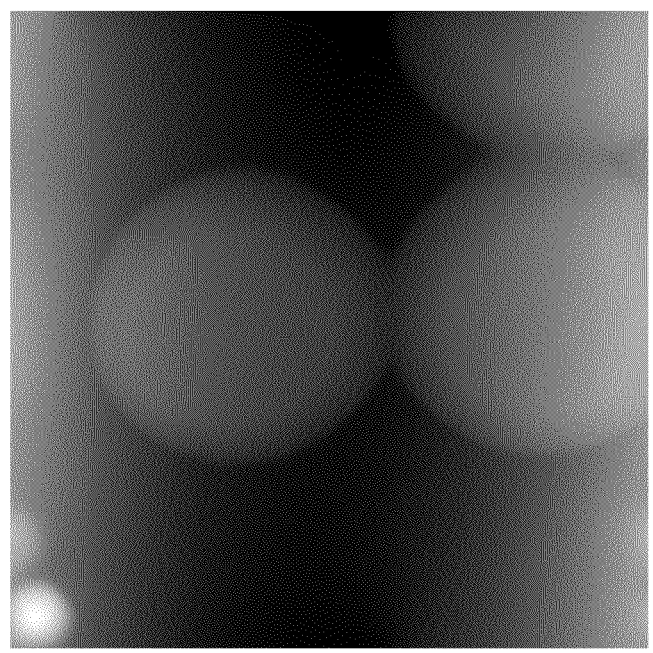

FIG. 6B: This is an integrated vector field (iVF) image according to the current invention. This image has pronounced depth, as manifested by the visible limb darkening of the globules, revealing them to be spheroids rather than discs.

Figure 6C:
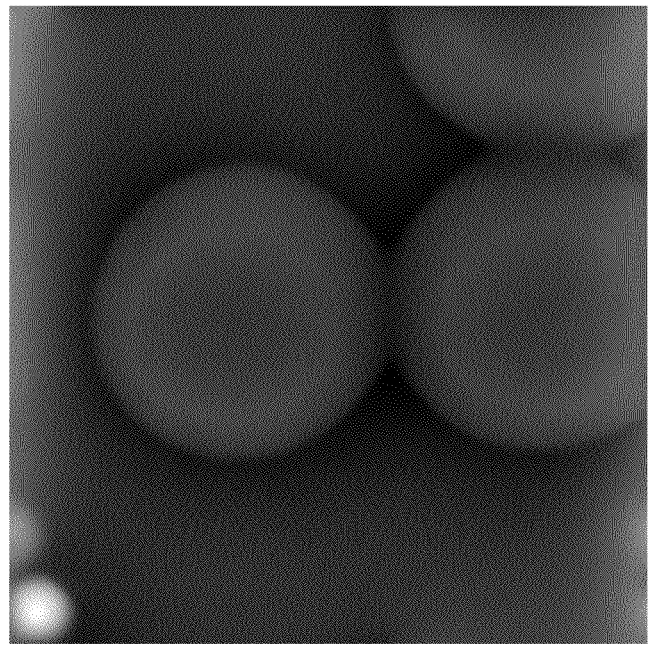

FIG. 6C: Here, the iVF image of FIG. 6C has been "cleaned up" (processed) by subjecting it to a high-pass filtering operation, thus yielding a processed iVF (PiVF) image, with even more striking depth definition.

Figure 6D:
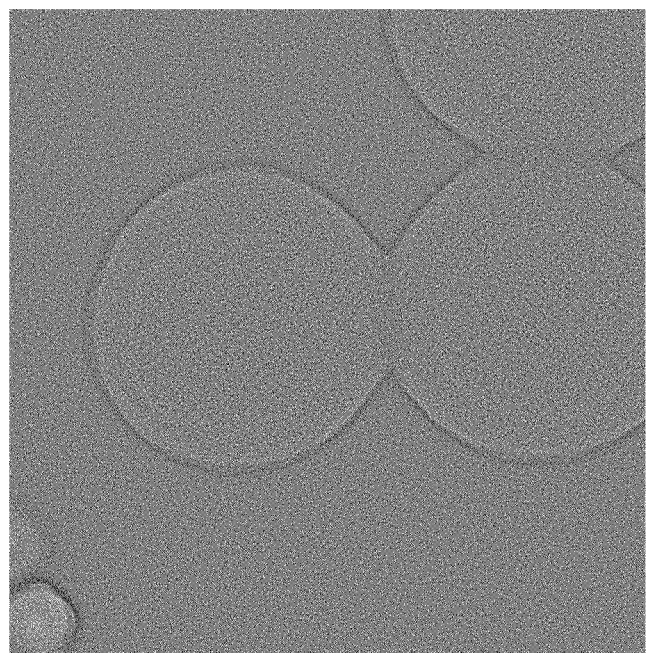

FIG. 6D: This image shows the subject of FIG. 6B after subjecting it to a Laplacian operation (to produce an LiVF image), and essentially renders a map of charge density in the sample. The outline of the globules is enhanced compared to the BF image of FIG. 6A, but the depth aspect of FIGS. 6B and 6C has been lost.

EMBODIMENT 6

Figure 7:
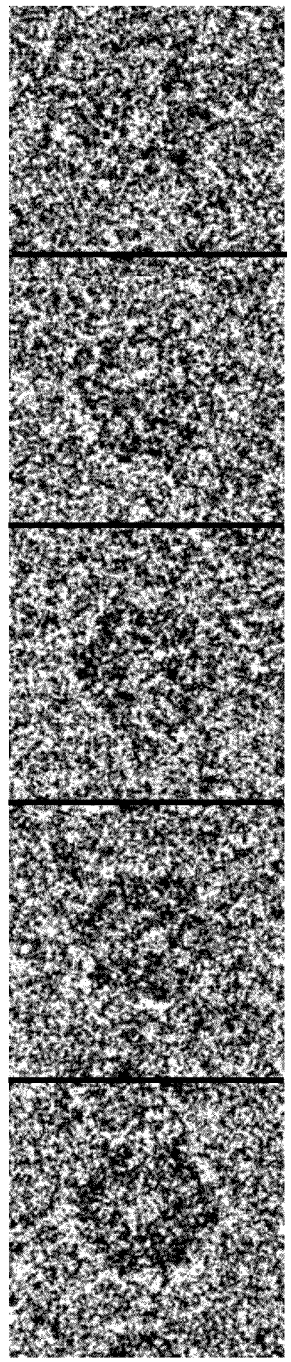
FIG. 7 shows different types of electron microscope images of a cryogenic sample comprising earthworm hemoglobin in a matrix of water ice, according to different aspects of the prior art and the present invention.
Figure 7:
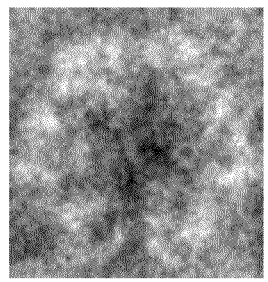

FIG. 7 shows different types of electron_microscope images of a cryogenic sample comprising earthworm hemoglobin (with a molecular form having six-fold symmetry) in a matrix of water ice, according to different aspects of the prior art and the present invention. More particularly, the individual images can be further elucidated as follows:

Left: Conventional (non-scanning) TEM (CTEM) images, depicting (from top to bottom) an image series with respective defocus values of 0.8 µm, 1.2 µm, 2.0 µm, 2.4 µm and 4.9 µm. Note that the largest employed defocus gives the best contrast in this series. The field of view in each member of this series is ca. 45 nm×45 nm.

Right: An integrated vector field (iVF) image according to the current invention, which renders much more detail than any of the CTEM images. The field of view in this case is ca. 30 nm×30 nm.

Note that the total electron dose was the same in both cases (10 e/Å$^2$—electrons per square Ångstrom), which is an extremely low dose typically stipulated for imaging biological samples under cryogenic conditions. Apart from the current invention, no STEM-based technique shows any meaningful signal under such low-dosage conditions.

EMBODIMENT 7

Figure 8A:
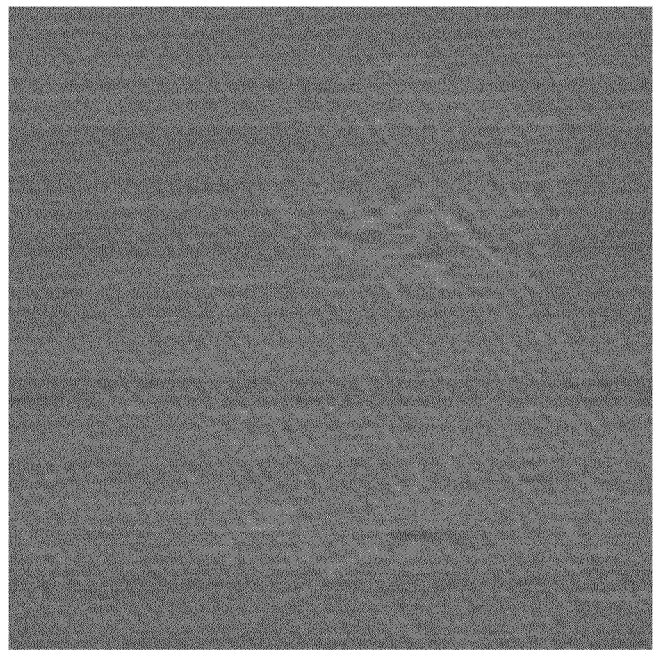
FIGS. 8A-8C show different types of STEM images of a sample comprising an anomalous carbon impurity on a graphene substrate, according to different aspects of the prior art and the present invention.
Figure 8B:
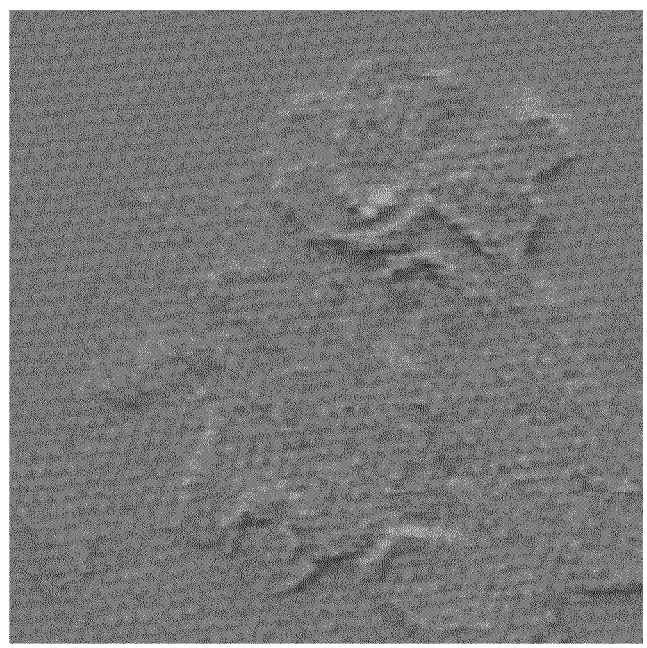
Figure 8C:
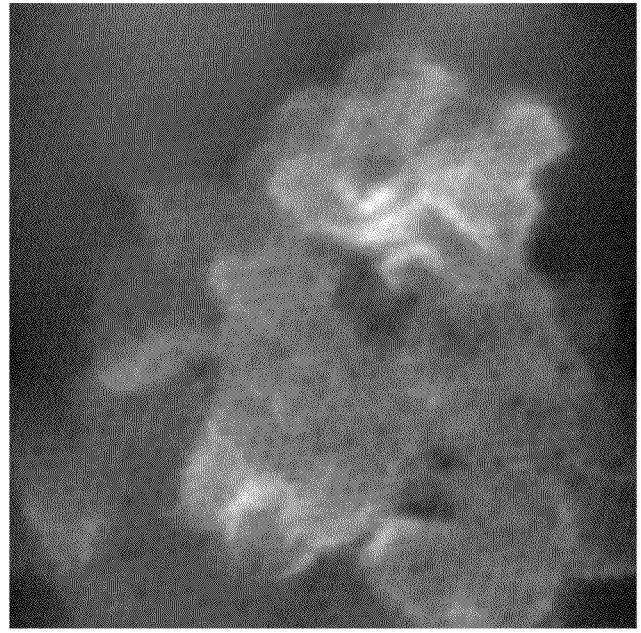

FIGS. 8A-8C show different types of STEM images of a sample comprising an anomalous carbon impurity on a graphene substrate, according to different aspects of the prior art and the present invention. More particularly, the individual images can be further elucidated as follows:

FIG. 8A: This is an Annular Bright Field (ABF) image, associated with (part of) a set-up such as that shown on the left side of FIG. 4. The image is relatively flat and dull.

FIG. 8B: This image was made using a four-quadrant detector in a set-up such as that depicted on the right side of FIG. 4 and in FIG. 2. It is a "subtractive" or "gradient" image, based on an S2-S4 signal. It has more depth and detail than FIG. 8A.

FIG. 8C: This is an integrated vector field (iVF) image according to the current invention. This image has pronounced depth and detail.

EMBODIMENT 8

Using a Position Sensitive Detector (PSD) and measuring a thin, non-magnetic sample, one obtains (by definition) the vector field image components as components of the center of mass (COM) of the electron intensity distribution $I_D(\vec{k}, \vec{r}_p)$ at the detector plane:

$$I_x^{COM}(\vec{r}_p) = \iint_{-\infty}^{\infty} k_x I_D(\vec{k}, \vec{r}_p) d^2\vec{k} \quad I_y^{COM}(\vec{r}_p) = \iint_{-\infty}^{\infty} k_y I_D(\vec{k}, \vec{r}_p) d^2\vec{k} \quad (18)$$

where $\vec{r}_p$ represents position of the probe (focused electron beam) impinging upon the sample, and $\vec{k}=(k_x, k_y)$ are coordinates in the detector plane. The full vector field image can then be formed as:

$$\vec{I^{COM}}(\vec{r}_p) = I_x^{COM}(\vec{r}_p) \cdot \vec{x}_0 + I_y^{COM}(\vec{r}_p) \cdot \vec{y}_0 \quad (19)$$

where $\vec{x}_0$ and $\vec{y}_0$ are unit vectors in two perpendicular directions.

The electron intensity distribution at the detector is given by:

$$I_D(\vec{k}, \vec{r}_p) = |\mathcal{F}\{\psi_{in}(\vec{r} - \vec{r}_p)e^{i\phi(\vec{r})}\}(\vec{k})|^2 \quad (20)$$

where $\psi_{in}(\vec{r} - \vec{r}_p)$ is the impinging electron wave (i.e. the probe) illuminating the sample at position $\vec{r}_p$ and $e^{i\phi(\vec{r})}$ is the transmission function of the sample. The phase $\phi(\vec{r})$ is proportional to the sample's inner electrostatic potential field. Imaging $\phi(\vec{r})$ is the ultimate goal of any electron microscopy imaging technique. Expression (19) can be re-written as:

$$\overrightarrow{I^{COM}}(\vec{r}_p) = \frac{1}{2\pi}(|\psi_{in}(\vec{r})|^2 * \nabla\varphi(\vec{r}))(\vec{r}_p) = -\frac{1}{2\pi}(|\psi_{in}(\vec{r})|^2 * \vec{E}(\vec{r}))(\vec{r}_p) \quad (21)$$

where $\vec{E}(\vec{r}) = -\nabla(\phi(\vec{r}))$ is the inner electric field of the sample—which is the negative gradient of the electrostatic potential field of the sample—and the operator "*" denotes cross-correlation. It is evident that the obtained vector field image $\overrightarrow{I^{COM}}(\vec{r}_p)$ directly represents the inner electric field $\vec{E}(\vec{r})$ of the sample. Its components are set forth in (18) above. Next, an integration step in accordance with the current invention is performed, as follows:

$$I^{ICOM}(\vec{r}_p) = \int_{l=\vec{r}_{ref}}^{\vec{r}_p} \overrightarrow{I^{COM}}(\vec{r}) d\vec{l} \quad (22)$$

using any arbitrary path l. This arbitrary path is allowed because, in the case of non-magnetic samples, the only field is the electric field, which is a conservative vector field. Numerically this can be performed in many ways (see above). Analytically it can be worked out by introducing (21) into (22), yielding:

$$I^{ICOM}(\vec{r}_p) = \frac{1}{2\pi}(|\psi_{in}(\vec{r})|^2 * \varphi(\vec{r}))(\vec{r}_p) \quad (23)$$

It is clear that, with this proposed integration step, one obtains a scalar field image that directly represents $\phi(\vec{r})$, which is the preferred object in electron microscopy.

EMBODIMENT 9

CPM imagery is often rather noisy, e.g. due to dose limitations. Subtracting two noisy signals so as to obtain the "subtractive" or "gradient" images referred to above (see FIGS. 5C, 5D, 8B for example) tends to increases the amount of attendant noise, resulting in a relatively low SNR. In order to mitigate this effect, one can obtain "enhanced" subtractive/gradient images by differentiating (once) the iVF (or PiVF) alluded to above [so as to obtain a diVF (or dPiVF) image, respectively]. In so doing, use can be made of the Frankot-Chelappa algorithm (see above) where, essentially, a potential $\phi$ is fitted to the noisy components of the measured electric field $\vec{E}$ so as to minimize:

$$\iint |\nabla\phi + \vec{E}|^2 dxdy$$

In this step, noise is regularized, as can be seen from the fact that the number of degrees of freedom (i.e. the number of pixels) is reduced by a factor of two (two images are combined into one resultant image). When the resulting potential is then differentiated, the number of degrees of freedom stays the same, and hence the resulting diVF (or dPiVF) images have less noise than the original images. The part of the noise that was removed is the part that cannot be written as the gradient of a scalar potential.

It should be noted that the single differentiation ($\nabla$; nabla/del) alluded to here produces a vector result—with, for example, X and Y components in the case of a Cartesian coordinate system. These components can, if desired, be calculated separately from one another, using partial differentiation $$\left(\text{e.g. } \frac{\partial}{\partial x} \text{ or } \frac{\partial}{\partial x}\right).$$

Figure 9:
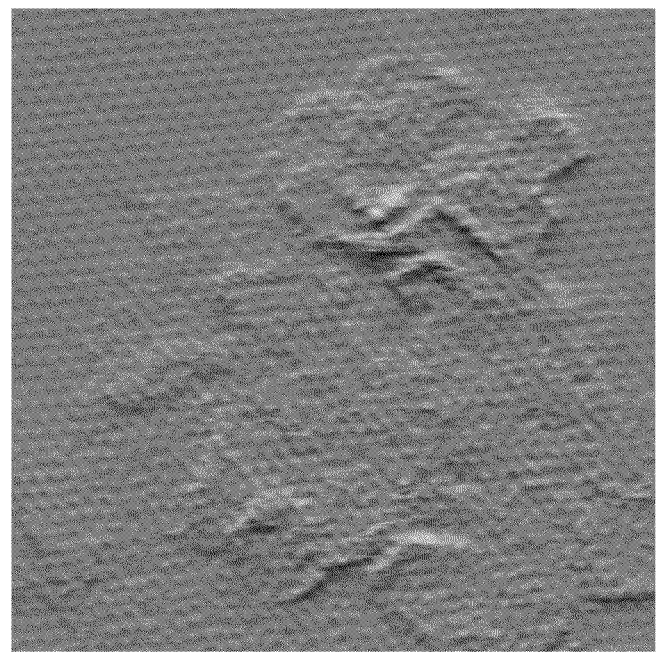
FIG. 9 shows an image of the same sample as in FIGS. 8A-8C, obtained using a particular aspect of the present invention.

An example of this technique is shown in FIG. 9, which pertains to the same sample as in FIGS. 8A-8C and Embodiment 7 above. FIG. 9 shows a diVF(Y) [partially differentiated w.r.t. Y] image as referred to here, and corresponds to an enhanced version of FIG. 8B (with much crisper detail).

We claim as follows:

1. A method of examining a sample in a charged-particle microscope of a scanning transmission type, comprising:
   providing a beam of charged particles that is directed from a source through an illuminator so as to irradiate the sample;
   providing a detector for detecting a flux of charged particles traversing the sample;
   causing said beam to scan across a surface of the sample, and recording an output of the detector as a function of scan position, resulting in accumulation of a charged-particle image of the sample,
   including:
   embodying the detector to comprise a plurality of detection segments;
   combining signals from different segments of the detector so as to produce a vector output from the detector at each scan position, and compiling this data to yield a vector field;
   mathematically processing said vector field by subjecting it to a two-dimensional integration operation, thereby producing an integrated vector field image.

2. A method according to claim 1, wherein:
   said detector is embodied to comprise four quadrants;
   said vector output is produced by calculating difference signals between complementary pairs of quadrants.

3. A method according claim 2, wherein said integrated vector field image is post-processed by subjecting it to at least one operation selected from the group comprising:
   filtering;
   opening Angle Correction;
   deconvolution correction,
   and combinations hereof.

4. A method according to claim 2, wherein the integrated vector field image is further manipulated by subjecting it to a Laplacian operation.

5. A method according to claim 2, wherein the integrated vector field image is further manipulated by subjecting it to a single differentiation operation.

6. A method according to claim 2, wherein said mathematical processing of vector field $\tilde{E}$ comprises finding an estimate $\hat{\phi}$ of a potential $\phi$ as a fitting problem involving functional minimization of an objective function J defined as:

$$J(\phi) = \iint |(-\nabla\phi) - \tilde{E}|^2 dxdy = \iint |\nabla\phi + \tilde{E}|^2 dxdy$$

for Cartesian coordinates (x, y) along a scan path of said beam on the sample.

7. A method according to claim 1, wherein:
- said detector is embodied as a pixelated detector comprising an array of pixels;
- said vector output is produced using a procedure comprising the following steps:
  - comparing pixel values to determine a location for a barycenter of said flux on the detector;
  - expressing a coordinate position of said barycenter on the detector.

8. A method according to claim 7, wherein the charged particles are electrons.

9. A method according claim 7, wherein said integrated vector field image is post-processed by subjecting it to at least one operation selected from the group comprising:
- filtering;
- opening Angle Correction;
- deconvolution correction,
and combinations hereof.

10. A method according to claim 7, wherein the integrated vector field image is further manipulated by subjecting it to a Laplacian operation.

11. A method according to claim 7, wherein the integrated vector field image is further manipulated by subjecting it to a single differentiation operation.

12. A method according to claim 7, wherein said mathematical processing of vector field $\tilde{E}$ comprises finding an estimate $\hat{\phi}$ of a potential $\phi$ as a fitting problem involving functional minimization of an objective function J defined as:

$$J(\phi) = \iint \|(-\nabla\phi) - \tilde{E}\|^2 dxdy = \iint \|\nabla\phi + \tilde{E}\|^2 dxdy$$

for Cartesian coordinates (x, y) along a scan path of said beam on the sample.

13. A method according to claim 1, wherein the employed detector is a Position-Sensitive Detector.

14. A method according to claim 1, wherein said integrated vector field image is post-processed by subjecting it to at least one operation selected from the group comprising:
- filtering;
- opening Angle Correction;
- deconvolution correction,
and combinations hereof.

15. A method according to claim 1, wherein the integrated vector field image is further manipulated by subjecting it to a Laplacian operation.

16. A method according to claim 1, wherein the integrated vector field image is further manipulated by subjecting it to a single differentiation operation.

17. A method according to claim 1, wherein said mathematical processing of vector field $\tilde{E}$ comprises finding an estimate $\hat{\phi}$ of a potential $\phi$ as a fitting problem involving functional minimization of an objective function J defined as:

$$J(\phi) = \iint \|(-\nabla\phi) - \tilde{E}\|^2 dxdy = \iint \|\nabla\phi + \tilde{E}\|^2 dxdy$$

for Cartesian coordinates (x, y) along a scan path of said beam on the sample.

18. A method according to claim 17, wherein said functional minimization is achieved with the aid of at least one technique selected from the group comprising:
- a Poisson solver technique;
- a Basis Function reconstruction;
- residual minimization using an Lp norm-based objective function;
- residual minimization using an M-estimator;
- anisotropic weighting;
- application of a Diffusion tensor;
- application of a regularization function,
and combinations hereof.

19. A method according to claim 1, wherein the charged particles are electrons.

20. A charged-particle microscope of a scanning transmission type, comprising:
- a sample holder, for holding a sample;
- a source, for producing a beam of charged particles;
- an illuminator, for directing said beam so as to irradiate said sample;
- a detector, for detecting a flux of charged particles traversing the sample in response to said irradiation;
- scanning means, for causing said beam to make a scanning motion relative to a surface of the sample;
- a controller, for recording an output of said detector as a function of scan position, resulting in accumulation of a charged-particle image of the sample, characterized in that:
- said detector comprises a plurality of detection segments;
- said controller is embodied to perform the following additional actions:
  - combine signals from different segments of the detector so as to produce a vector output from the detector at each scan position, and compile this data to yield a vector field;
  - mathematically process said vector field by subjecting it to a two-dimensional integration operation, thereby producing an integrated vector field image.

* * * * *